United States Patent [19]

Bouchaib

[11] Patent Number: 4,498,416
[45] Date of Patent: Feb. 12, 1985

[54] INSTALLATION FOR TREATMENT OF MATERIALS FOR THE PRODUCTION OF SEMI-CONDUCTORS

[75] Inventor: Pierre Bouchaib, L'Etang la Ville, France

[73] Assignee: Instrument S.A., Paris, France

[21] Appl. No.: 547,463

[22] Filed: Nov. 2, 1983

Related U.S. Application Data

[63] Continuation of Ser. No. 339,590, Jan. 15, 1982, abandoned.

[30] Foreign Application Priority Data

Jan. 27, 1981 [FR] France ................................ 81 01486

[51] Int. Cl.³ .............................................. C23C 13/08
[52] U.S. Cl. ...................... 118/719; 118/50; 118/729; 118/733; 118/500; 414/217; 414/222; 414/287
[58] Field of Search ............. 118/719, 729, 733, 728, 118/50, 500; 414/217, 287, 222

[56] References Cited

U.S. PATENT DOCUMENTS

| | | | |
|---|---|---|---|
| 3,404,661 | 10/1968 | Mathias et al. | 118/719 |
| 4,047,624 | 9/1977 | Dorenbos | 118/719 |
| 4,412,771 | 11/1983 | Gerlach et al. | 118/729 X |
| 4,433,951 | 2/1984 | Koch et al. | 414/217 |

Primary Examiner—John D. Smith
Assistant Examiner—Bernard F. Plantz
Attorney, Agent, or Firm—Pollock, Vande Sande & Priddy

[57] ABSTRACT

Installation for treatment of materials for semi-conductors, starting from slices (30) gathered onto carriers (5) and treated in a series of vacuum chambers. The installation is in modular form, each module (A, B, C, D) including a straight tubular portion (1, 2, 3, 4) which forms with the adjacent modules a continuous tunnel for straight flow of the carriers (5). The carriers are driven and the slices are individually manipulated between the carriers and the treatment apparatus. The invention is applicable to treatment by epitaxis by molecular jets.

1 Claim, 5 Drawing Figures

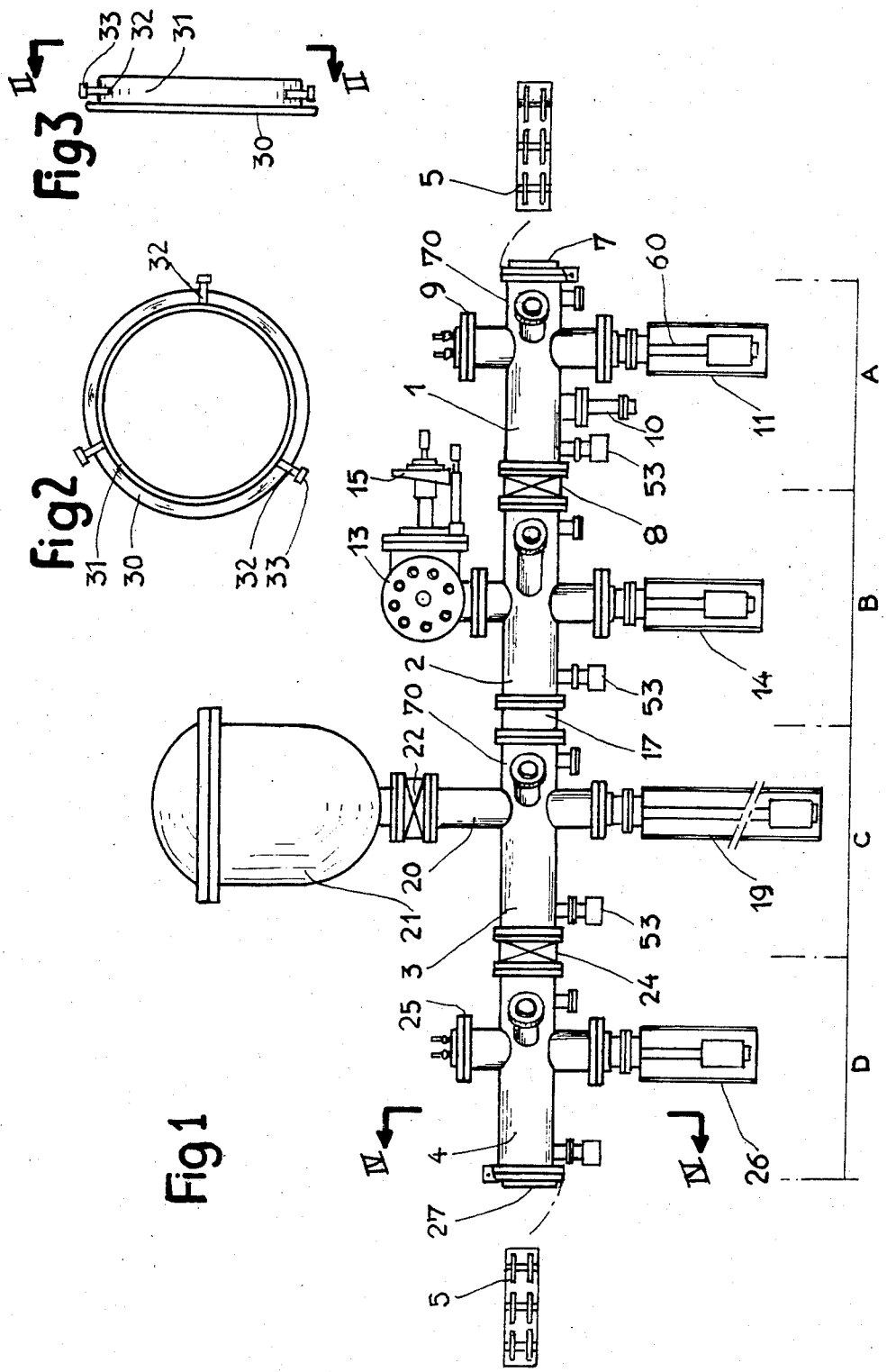

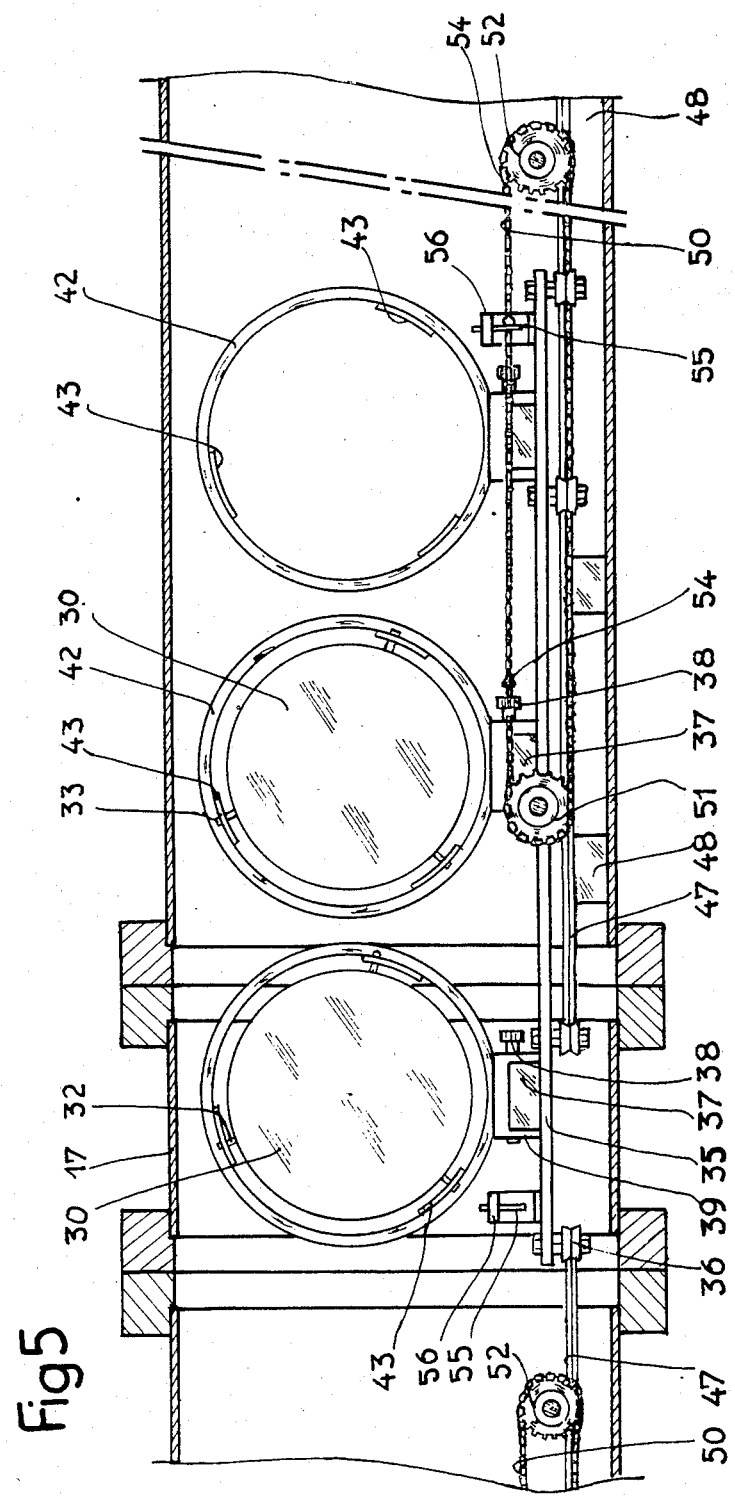

INSTALLATION FOR TREATMENT OF MATERIALS FOR THE PRODUCTION OF SEMI-CONDUCTORS

This application is a continuation of application Ser. No. 339,590, filed Jan. 15, 1982, now abandoned.

FIELD OF THE INVENTION

The present invention refers to an installation for treatment of materials for to the industrial production of semi-conductors for electronic application, and particularly for the treatment of small circular plates or "slices" of crystalline semi-conductors by the process known as epitaxis by molecular jets.

BACKGROUND OF THE INVENTION

A known process of this kind, the essential phases of which are carried out under high vacuum, includes mainly the passing of the "slice" into a deposition chamber in which by molecular projection, there is formed the active layer which, will then be cut up in order to form the semi-conductor components. Various operations, preparatory or complementary, precede or follow the operation of deposition, these various operations (heating, analysis, ionic bombardment, for example) being variable, depending upon the nature or the final destination of the resulting product.

At the present time, the known installations include an introduction chamber and an intermediate chamber upstream of the deposition chamber, each chamber being connected to vacuum equipment, with isolating valves between those chambers which are to be placed under different pressures. Hence the travel of a slice between its entering and its leaving the same chamber forms a journey outwards and return by the same route, so that the entire process must be completed before the next slice can be treated. The result is considerable dead time for the operation of the deposition chamber or of the auxiliary treatment apparatus, as well as vacuum losses which compel increased operation of the vacuum pumps and, in short, inefficient performance of the installation.

Attempts have already been made to replace slice-by-slice introduction into the installation by the introduction of "cassettes", i.e., of carriers upon which a number of slices may be arranged simultaneously, which are then manipulated together or one by one, depending upon whether the phases of the process are to be carried out as a whole or individually. The employment of carriers already enables the number of openings up to the free air of the introduction chamber, and consequently the employment of the vacuum pumps to be reduced but the complete treatment of all of the slices in a carrier must still take place before another carrier can be reloaded. Hence dead times persist for certain of the apparatus, which are not very compatible with the necessity of increasing the rhythm of production.

SUMMARY OF THE INVENTION

The invention, in particular through more continuous flow of the slices, enables more effective employment of the various apparatuses and an improvement in the efficiency of the installation.

The invention is applicable to an installation for treatment of materials for the production of semi-conductors from slices of crystalline materials, gathered into cassettes carrying a number of slices at once, the various treatments being carried out in chambers connected to vacuum equipment, connected together by isolating valves and connected to the outside by at least one airtight door for introduction of the carriers.

In accordance with the invention, the installation is created in modular form, each module including:

(a) a straight cylindrical tubular portion on opposite sides of which are arranged the treatment apparatuses, the whole of the cylindrical portions being connected together into one continuous tunnel, with the interposition of isolating valves between modules intended for working at different pressures;

(b) an internal portion of rail arranged in the same fashion in parallel with the axis of the cylindrical portion so as to form in the continuous tunnel a succession of portions of aligned rails interrupted at right angles to the connections of the modules, the cassettes being moreover built in carriage form, the position of the wheels of the carriage and the profile of the rail being determined so as to keep the carriage on one portion of the rail when one portion of the carriage is passing over an interruption in the rail;

(c) means operated from outside for bringing about the movement of a carrier along the rails, specified so that a carrier is taken over by the device proper to any one module before having been released by the device proper to the preceding module; and (d) means operated from outside for manipulating individually the slices in a carrier between the carrier and apparatus associated with the module, or between different locations in the carrier.

BRIEF INTRODUCTION TO THE DRAWINGS

The invention will be better understood by referring to a particular embodiment given by way of example and represented in the drawings attached.

FIG. 1 is a simplified overall view of a chain created in accordance with the invention for putting into effect the process of epitaxis by molecular jets for slices of crystalline semi-conductors.

FIGS. 2 and 3 represent such a slice mounted upon a support for manipulation. FIG. 2 is a view of the assembly from the side of the support according to II—II in FIG. 3. FIG. 3 is a profile view of the assembly.

FIG. 5 is a longitudinal section along V—V in FIG. 4, and shows the passage of a carrier from one section to another of the chain.

DETAILED DESCRIPTION OF AN EMBODIMENT

Figure 4:
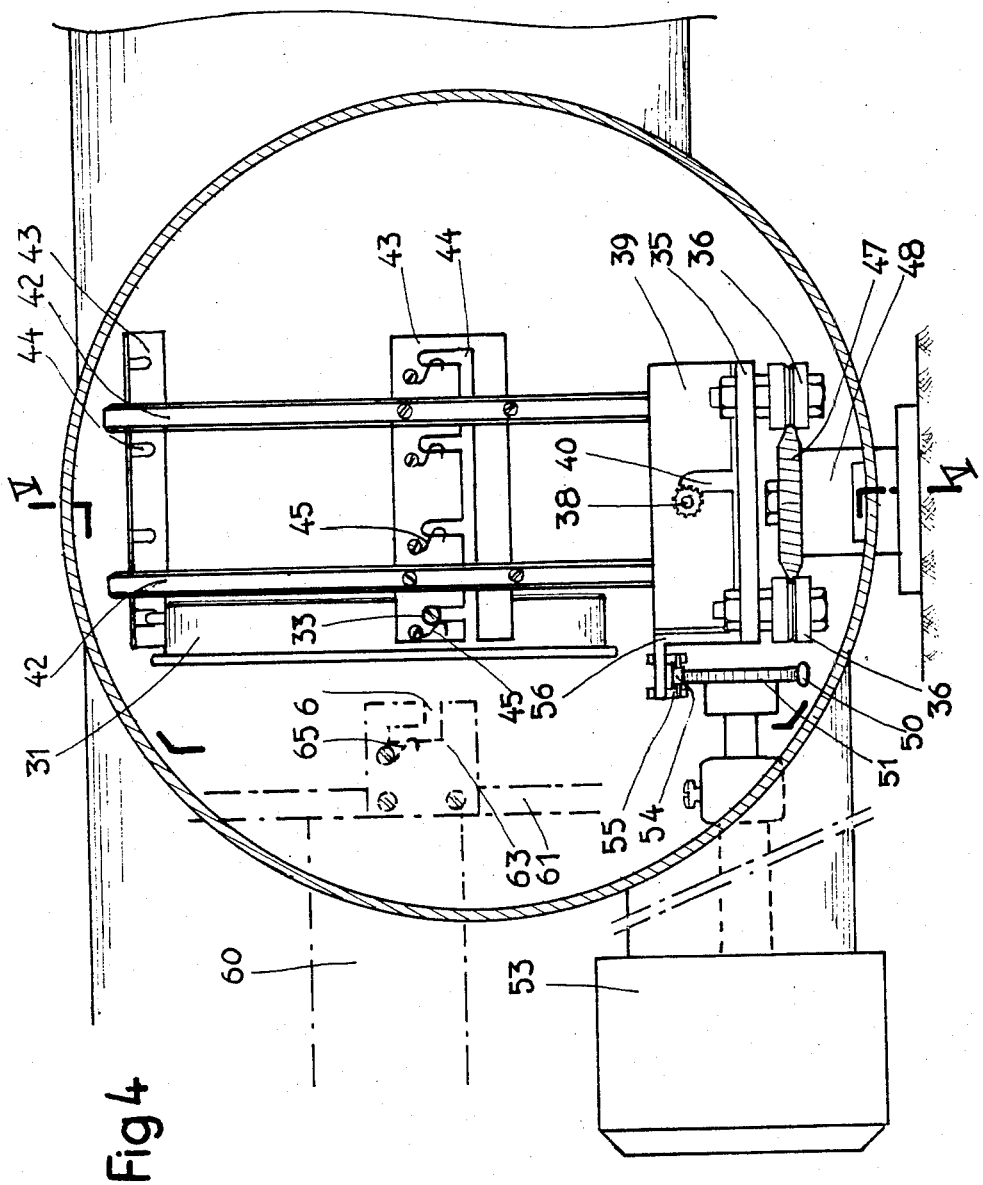
FIG. 4 is a simplied cross-section of the chain in the direction IV—IV in FIG. 1.

Referring first of all to FIG. 1, the treatment chain represented summarily as a whole is of generally modular structure, four successive modules A, B, C and D being shown. Each module includes a main section of passage 1,2,3,4 in the form of a straight cylindrical tube with various apparatus for treatment, driving or manipulation arranged along opposite sides of the cylindrical section. The four sections 1,2,3,4 are connected in alignment in order to form a continuous tunnel interrupted by isolating valves between certain modules and blocked at each end by airtight doors. The interior of each module is connected in a conventional fashion to a vacuum pump (not shown).

The slices to be treated are arranged beforehand in carriers upon carriers 5, to be described in greater detail, hereinbelow, together with the means employed for moving the carriers through all of the modules.

The module A is here a module for loading the carriers into the chain and for preparation of the slices. It includes a door 7 for introduction and is separated from the module B by an isolating valve 8. In this module A are found apparatus for preparation of the slices, such as a heater station 9 and a station for cleaning by ionic bombardment 10. With this module is also associated an apparatus 11 having a transfer bar for the manipulation of the slices inside the module.

The next module B is an analysis module equipped with a station 13 for analysis of the surface of the slices, for example by energy spectrometry. It also includes an apparatus 14 having a transfer bar, similar to the apparatus 11 in module A. Manipulator equipment 15 is also associated with the analysis apparatus 13. The module B is connected to the next module C by a simple connector collar 17 without an isolating valve. It will be noted that the bulk of the open collar 17 is the same as that of an isolating valve like the valve 8 between the modules A and B.

The module C is a simple transfer module equipped with an apparatus 19 having a transfer bar, of the same type as the apparatus 11 or 14, but having a longer reach. Opposite the apparatus 19 the collar includes a duct 20 which terminates in the deposition chamber 21 with the interposition of an isolating valve 22.

The final module D connected to the module C by the isolating valve 24, is a module for withdrawal of the carriers 5 leaving the chain. Like the module, A, it includes a heater station 25 and an apparatus 26 having a transfer bar, and is blocked at the end by the outlet door 27.

Reference will now be made to FIGS. 2 and 3, which show the structure of a slice which is to be treated in the installation. The slice 30 proper of crystalline semi-conductor material is made solid with a metal support 31 in the form of a flat ring. The ring 31 carries three radial pins 32 which are angularly equidistant each end each in a head 33.

FIGS. 4 and 5 show the structure of a carrier for supporting slices; it is shown in side elevation in FIG. 5 and in end view in FIG. 4. The carrier includes a supporting plate 35 equipped at each end with a set of four free wheels 36 having vertical axes. Each wheel 36 is of generally diabolo shape having a central trapezoidal throat. The plate 35 supports three centering blocks 37 having a screw 38 projecting at the side. The direct supports of the slices consist of assemblies each carried by a head 39 which caps a support 37 upon which it is positioned by a bayonet groove 40 and locked by tightening the screw 38. The head 39 supports two vertical hoops 42 connected by three angularly equidistant curved plates 43 each exhibiting a cutout like a comb 44, open at one end. Each slice is put in place on the carrier (see FIG. 4), by engaging the pins 32 each in a groove 44 until opposite one tooth of the comb and then by a slight rotation the three pins simultaneously enter the same tooth in the three plates 43. The inner face of the heads 33 is at a distance from the center of the slice scarcely greater than the outer radius of the curved plates 43, with the result that the slices are held in angular position by snapping of the small springs 45 against the heads 33 when the pins 32 have been correctly engaged into the teeth of the comb.

The slice-carrying carrier which has just been described is supported inside the modules by flat rails 47 the bevelled ends of which engage in the trapezoidal throats of the free wheels 36. Each module A,B,C,D includes such a rail 47 carried by supports 48 attached to the wall of the module. As may be seen more particularly in FIG. 4, in each module the rail 47 projects slightly beyond the end of the module, but the presence between two modules of either a connecting collar like 17 or an isolating valve like 24, brings about a discontinuity between two rails 47 of two consecutive modules, this discontinuity being necessary in order to enable closure of the valve if necessary. However, the arrangement of the bevels at the side of the rail, engaged in the throats in the wheels 36, enables the carrier to be retained on the rail even if one of the ends of the carrier overhangs a discontinuity of the rail, and the carrier can pass over these discontinuities. The front wheels engage with the rail downstream before the rear wheels have left the rail upstream.

The movement of a carriage inside a module or from one module to the other is assured by an endless chain device 50. The chain 50 is wrapped round a driving sprocket 51 and return sprocket 52. The driving sprocket 51 is driven from an external motor 53. The chain 50 carries at regular intervals lugs 54 the projecting side portions of which come into contact with abutments 55 which surround the chain 50 after the style of a head from supports 56 integral with the baseplate 35 of the carriage.

In order to understand clearly the method of operation and the advantages of the installation which has just been described, it will be assumed that a carrier 5 has just been introduced into the introduction module A. Of three circular slice-supports, only two are filled with slices and the third is empty. Once the door 7 is closed and the vacuum is established in the module A, for example, at $10^{-9}$ Torr, the slices are brought one by one to the heating station 9. For this purpose the transfer-bar device 11 which can be manipulated from outside, includes a crossbar 60 which ends inside the module in a circular plate 61 (FIG. 4). The plate 61 carries at its periphery three curved plates 63 similar to the plates 43 but having a cutout 64 with only one tooth and each equipped with a snap spring 65 similar to the springs 45 on the carrier. The cutouts 64 in the plate 61 are first engaged over the pins 32 on a slice, and then the plate 61 is rotated in order to bring the pins to the bottom of the tooth 64 where they are held by the springs 65. By continuing to turn, the pins 32 can be freed from the springs 45 and they can then be brought onto the axis of the straight groove 44. The slice is then locked to the plate 61 and, by pulling on it, the slice can be freed totally from the carrier. By a longitudinal movement of the carrier the passage is freed for bringing the slice to the heater station 9 where, by a reverse manoeuvre it is put in place on a support of the same bayonet type.

After heating and by the same means, the slice is returned to wait for an empty station on the carrier and another manipulation may be carried out upon another slice. Transfer bars 60 include axial and angular indexing marks in order to locate the catcher plates 63 in the required positions for picking up or putting the slices back in place in the required locations on the carrier. The manipulations may be facilitated by direct examination through sidelights 70.

When all of the slices have been treated at the heating stations 9 and cleaning stations 10, the valve 8 is opened and the carrier transferred into the module B. It will be observed that, during the transfer, the carrier will be taken over by the lugs 54 on the downstream chain which will engage against the front abutments 55 of the carrier before the rear abutments 55 have been freed by the lugs 54 on the upstream chain. After closure of the valve 8, the module A is ready to receive another carrier without waiting for all of the slices on the preceding carrier to have undergone the whole of the treatment process. The same thing will apply at each stage in another module where the slice-by-slice manipulations are carried out in the same fashion by means of the transfer pin devices 14, 19 and 26, until the discharge through door 27.

It will be seen that treatment of the slices on another cassette can commence in each module as soon as the previous carrier has been transferred to the next module, with the result that all of the apparatus in the chain can work with a minimum of dead time. Depending upon the relative duration of the operations of each apparatus, parallel identical modules may be installed, each treating only half of the slices which pass through it.

I claim:

1. An installation comprising a series of modules for the sequential treatment, in vacuum chambers, of materials for the production of semi-conductors from slices of crystalline metarials, said slices being carried in complete batches by carriers (5) moved seriatim through said installation, and further comprising at least one airtight door (7) for introduction of said carriers into a first of said modules and at least one airtight door (27) for removal of said carriers from a last of said module, each of said modules comprising (a) a straight, cylindrical tubular portion (1, 2, 3, 4) comprising rail means (47) parallel with the axis of the latter;
(b) a treatment chamber laterally offset from said tubular portion;
(c) means (61, 63) operated from the exterior of said module for manipulating the individual slices in said carrier and a said treatment means in a given module, and between different locations of said carrier, said means comprising a transfer bar (60) terminating in a circular plate (61) carrying a plurality of curved plates (63) with recess means (64) for selectively engaging a portion of a support (31) for a said slice to enable removal of said slice from said carrier;
(d) endless chain means (50, 51, 52) operated from the exterior of said modules for moving a said carrier along said rail means (47), said chain means carrying regularly spaced lugs having lateral projections which contact abutments (55) on said carrier surrounding said chain means, successive modules being disposed with their tubular portions and rail means aligned; and
(e) each of said carriers (5) having wheels (36), the position of said wheels and the cross section of said rail means (47) being so determined as to maintain a said carrier (5) on one portion of said rail when a portion of said carrier (5) is passing over an interruption of said rail means (47)
(f) valve means (8, 24) being interposed between successive modules operating under different pressures.

* * * * *